United States Patent [19]
Minami

[11] Patent Number: 5,396,521
[45] Date of Patent: Mar. 7, 1995

[54] RECEIVER CAPABLE OF REDUCING POWER CONSUMPTION IN A PLL CIRCUIT

[75] Inventor: Yoichiro Minami, Tokyo, Japan

[73] Assignee: NEC Corporation, Tokyo, Japan

[21] Appl. No.: 136,883

[22] Filed: Oct. 18, 1993

[30] Foreign Application Priority Data

Oct. 19, 1992 [JP] Japan .................... 4-279728

[51] Int. Cl.⁶ ............................................. H04L 27/14
[52] U.S. Cl. ..................................... 375/344; 375/376; 375/317; 329/307; 455/260; 455/265; 331/14
[58] Field of Search ..................... 375/52, 76, 80–81, 375/83, 97, 120; 329/304, 306–310, 346; 455/38.3, 260, 264–265, 324, 343; 331/14

[56] References Cited

U.S. PATENT DOCUMENTS

| | | | |
|---|---|---|---|
| 4,673,892 | 6/1987 | Miyashita et al. | 331/14 |
| 4,916,405 | 4/1990 | Keate et al. | 329/308 |
| 5,065,107 | 11/1991 | Kumar et al. | 375/97 |
| 5,091,921 | 2/1992 | Minami | 375/97 |

*Primary Examiner*—Stephen Chin
*Assistant Examiner*—Young Tse
*Attorney, Agent, or Firm*—Sughrue, Mion, Zinn Macpeak & Seas

[57] ABSTRACT

In a receiver for use in demodulating a modulated wave modulated by a digital data signal arranged within a preselected channel to produce a reproduced data signal by the use of a local frequency signal of a local frequency, a VCO and a PLL circuit are intermittently put into active states with reference to an offset frequency between a channel frequency and the local frequency. The PLL circuit is put into the active state for a time interval determined by the offset frequency before reception of the preselected channel while the VCO is put into the active state during the active state of the PLL circuit and during reception of the preselected channel. A duration of the active state in the PLL circuit becomes long when the offset frequency does not fall within a predetermined range determined by predetermined offset frequencies and, otherwise, the duration of the active state in the PLL circuit becomes short. The offset frequency is detected by a frequency detector which produces a control signal appearing only when the offset frequency is present outside of the predetermined range. The control signal is sent to a control circuit for controlling battery saving operations of the VCO and the PLL circuit.

8 Claims, 8 Drawing Sheets

RECEIVER CAPABLE OF REDUCING POWER CONSUMPTION IN A PLL CIRCUIT

BACKGROUND OF THE INVENTION

This invention relates to a receiver which receives a modulated wave which carries a baseband signal of a binary digital signal and which may be subjected to FSK (Frequency Shift Keying), although this invention may not be restricted to the FSK.

Recently, such a receiver has becomes smaller and smaller with the development of a semiconductor integrated circuit technique. In a receiver of a superheterodyne type, a radio section usually comprises a high frequency amplifier, and an intermediate frequency filter, which can not be simply manufactured by the semiconductor integrated circuit technique. Therefore, it has been pointed out that the size of the receiver is limited.

In order to make such a receiver smaller in size and lighter in weight, direct conversion, namely, quadrature detection, has been proposed to detect or demodulate a modulated wave may convey a baseband signal of POCSAC codes. More specifically, a local oscillation frequency is controlled to be matched with a channel frequency received by a receiver and to extract a beat frequency between the local oscillation frequency and the channel frequency. With this receiver, the baseband signal alone is directly extracted from the beat frequency through a low pass filter (LPF) after amplitude limitation and is demodulated by a demodulator into a reproduced baseband signal.

When the direct conversion is used to demodulate the modulated wave, the local oscillation frequency is substantially equal to the channel frequency with only a phase difference component or an offset signal component left between the local oscillation frequency and the channel frequency. Thus, the direct conversion can eliminate render an intermediate frequency and, as a result, can avoid production of an image frequency. Therefore, such direct conversion dispenses with the necessity of a filter which has a high selectivity to attenuate the image frequency which might occur in a high frequency amplifier and an intermediate frequency amplifier.

In addition, the above-mentioned receiver essentially comprises a channel filter for attenuating a jamming wave imposed on adjacent channels. However, it is possible to structure such a channel filter by an active low frequency pass filter which can be manufactured by the semiconductor integrated circuit technique.

Heretofore, a proposal has been made to combine an FSK receiver with a phase locked loop circuit PLL so as to receive a modulated wave which subjects a baseband signal to FSK and which may be referred to as an FSK modulated wave. Specifically, the PLL circuit is used as a local oscillation circuit to produce a local oscillation signal of a local oscillation frequency. The local oscillation frequency is substantially equal to each of channel frequencies. At any rate, the PLL circuit can receive a plurality of channel frequencies by the use of a single quartz crystal in conjunction with a frequency divider and, a read-only memory (ROM).

The FSK receiver may be used as a paging receiver in a paging system which has a plurality of zones to which the channel frequencies are individually preassigned. The above-mentioned receiver which comprises the PLL circuit can receive each of the channel frequencies even when the channel frequencies are changed from one to another due to movement of the receiver from one zone to another zone.

However, the PLL circuit consumes large electric power so as to carry out a PLL operation. In other words, the receiver of the above-mentioned type is disadvantageous in that power consumption becomes large in the PLL circuit. As a result, the paging receiver which is driven by a small battery has a very short life time due to the large power consumption in the PLL circuit.

SUMMARY OF THE INVENTION

It is an object of this invention to provide a receiver which is capable of reducing power consumption even when a PLL circuit is used.

It is another object of this invention to provide a receiver of the type described, which is capable of generating a wide variety of local oscillation frequencies by the use of a single quartz crystal.

It is still another object of this invention to provide a receiver of the type described, which is applicable to a paging receiver and which has a long life time.

A receiver to which this invention is applicable is operable in response to a modulated signal which is subjected to modulation by a baseband digital signal and which has a channel frequency. The radio receiver comprises demodulating means supplied with said modulated signal and a local frequency signal of a local frequency for carrying out demodulation of the modulated signal by the use of the local frequency signal to produce the baseband digital signal as a demodulated signal and local signal supplying means, which has a phase locked loop selectively put into an inactive state and an active state, for supplying the local frequency signal to the demodulating means. According to this invention, the receiver further comprises frequency difference detecting means coupled to the demodulating means for detecting a frequency difference between the channel frequency and the local frequency to judge whether or not the frequency difference falls within a predetermined range and to produce a control signal when the frequency difference exceeds the predetermined range and controlling means coupled to the frequency difference detecting means and the local signal supplying means for controlling the local signal supplying means to put the phase locked loop of the local signal supplying means into the active state in the presence of the control signal so as to keep the local frequency under control of the phase locked loop and, on the other hand, to put the phase locked loop into the inactive state in the absence of the control signal so as to keep the local frequency with the phase locked loop kept inactive.

DESCRIPTION OF THE PREFERRED EMBODIMENTS

Figure 1:
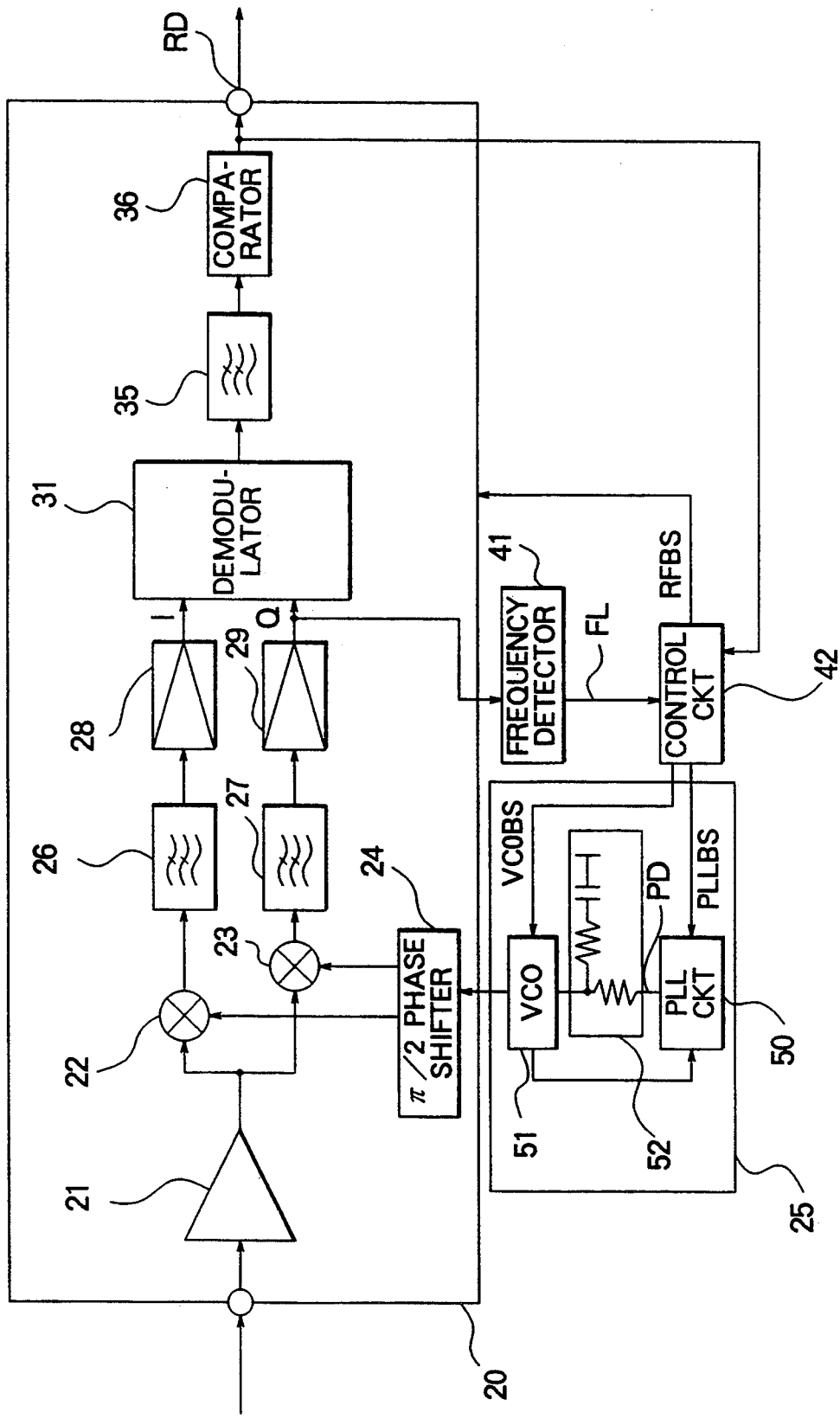
FIG. 1 is a block diagram of a receiver according to a preferred embodiment of this invention.

Referring to FIG. 1, a receiver according to a preferred embodiment of this invention is supplied with an input signal which may be an FSK modulated wave modulated by a baseband signal of POCSAG codes or the like and which is obtained by subjecting the baseband signal to FSK. The FSK modulated wave is obtained by modulating a channel frequency by the baseband signal. In addition, it is readily understood that the baseband signal itself is composed of a digital data signal specified by a mark or a space.

More particularly, the receiver comprises a direct converter 20 which receives the FSK modulated wave from an antenna (not shown) and which produces a reproduced data signal in a manner to be described later in detail. In the direct converter 20, the FSK modulated signal is input to a high frequency amplifier 21 to be amplified into an amplified modulated signal which is delivered to first and second mixers 22 and 23. The first and second mixers 22 and 23 are connected to a phase shifter 24 which receives a local frequency signal from a local frequency oscillation circuit 25. The local frequency signal has a local frequency.

The phase shifter 24 shifts a phase of the local frequency signal to produce first and second local signals both of which have phases different from each other by 90°, namely, $\pi/2$ radians. Specifically, the first local signal is obtained by rotating the phase of the local frequency signal by +45° while the second local signal is obtained by rotating the phase of the local frequency signal by −45°. As a result, the first local signal has a frequency identical with that of the second local signal with the local frequency of the local frequency signal kept unchanged. It should be noted that the local frequency of the local frequency signal is substantially equal to the channel frequency which is equal to a non-modulated wave frequency.

The first and second mixers 22 and 23 carry out frequency conversion of the amplified modulated signal by mixing the amplified modulated signal with the first and the second local signals to produce first and second frequency converted signals, respectively. Inasmuch as each of the first and the second local signals has the frequency substantially equal to the channel frequency, as mentioned before, each of the first and the second frequency converted signals that appears as a beat signal having a beat frequency which specifies the baseband signal. The first and the second frequency converted signals are sent to first and second low pass filters (LPF's) 26 and 27 in which first and second baseband components alone are subjected to band restriction of a noise signal to be extracted from the first and the second frequency converted signals.

The first and the second baseband components are supplied to first and second limiters 28 and 29 to be digitalized into first and second baseband digital signals I and Q which may be referred to as in-phase and quadrature baseband signals, respectively. The first and the second baseband digital signals I and Q have the phase differences of 90° relative to each other and are sent to a demodulator 31.

Figure 2:
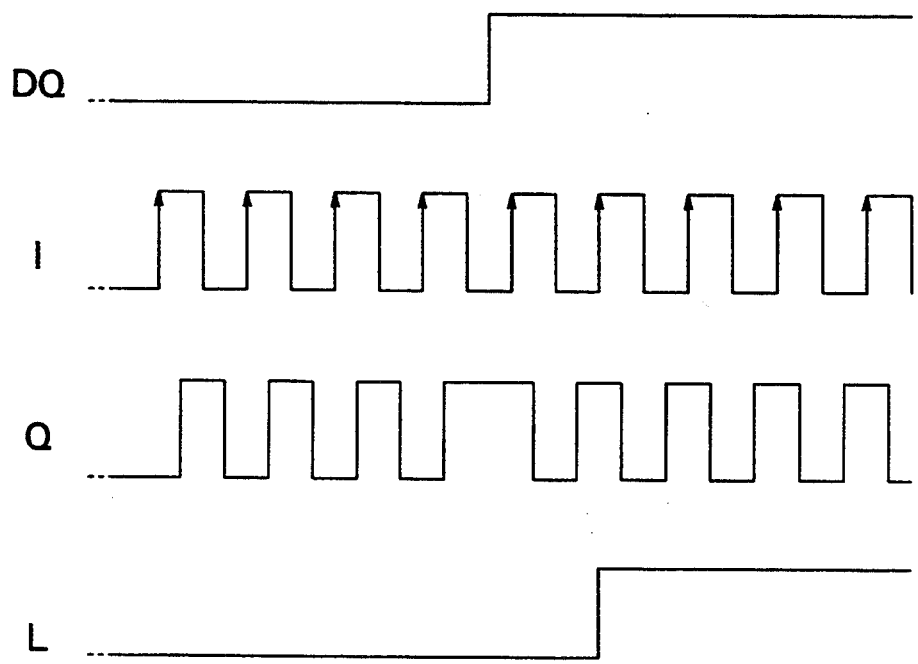
FIG. 2 is a time chart for use in describing operation of a part of the receiver illustrated in FIG. 1.

As shown in FIG. 2, the second baseband digital signal Q conveys the digital data signal as depicted at DQ in FIG. 2 and is demodulated into a demodulated data signal L by the demodulator 31. This shows that the digital data signal DQ acts as a modulation signal to modulate the second baseband digital signal depicted at Q in FIG. 2. In the illustrated example, no digital data signal is included in the first baseband digital signal I.

Figure 3:
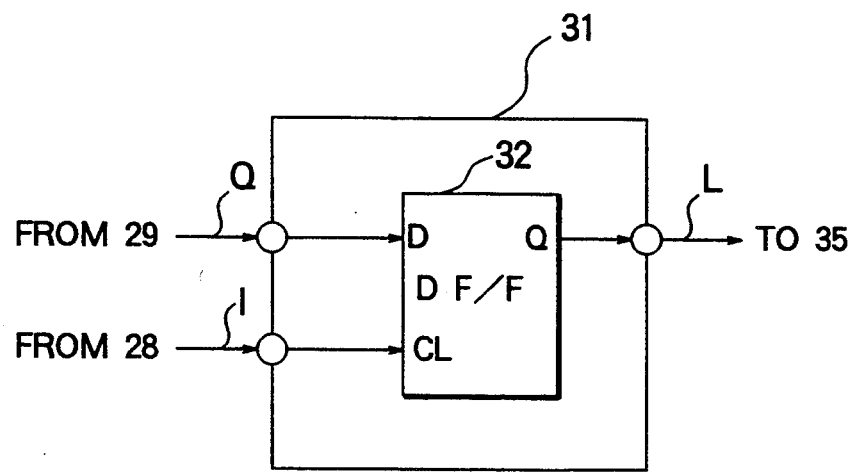
FIG. 3 is a block diagram of a demodulator included in the receiver illustrated in FIG. 1.

Referring to FIG. 3, the demodulator 31 comprises a delay flip flop (D F/F) 32 which has a data input terminal D, a clock terminal CL, and an output terminal Qo. In the illustrated example, the data input terminal D of the D F/F 32 inputs the second baseband digital signal Q as illustrated in FIG. 2, while the clock terminal CK is given the first baseband digital signal I as shown in FIG. 2. The second baseband digital signal Q is sampled at each leading edge of the first baseband digital signal I, as symbolized by arrows in FIG. 2, and, as a result, the second baseband digital signal Q is converted into the demodulated data signal L which appears through the output terminal Qo of the D F/F 32.

Although the second and the first baseband digital signals Q and I are given to the data input terminal D and the clock terminal CL, respectively, the data input terminal D and the clock terminal CL of the D F/F 32 may be considered as the clock terminal CL and the data input terminal D for the first and the second baseband digital signals I and Q, respectively. Consequently, the first baseband digital signal I can be also demodulated into the demodulated data signal by the illustrated D F/F 32 in a manner similar to that mentioned in conjunction with the second baseband digital signal Q when the digital data signal is included in the first baseband digital signal I. Thus, the demodulated data signal L includes both of the digital data signals carried by the first and the second baseband digital signals I and Q. The demodulated data signal is sent to a low pass filter (LPF) 35 to remove a noise component and is thereafter output to a comparator 36 to be digitalized into an output binary digital signal or the reproduced data signal.

As shown in FIG. 1, the receiver comprises a frequency detector 41 and a control circuit 42 together with the direct converter 20 and the local frequency oscillation circuit 25.

Figure 4:
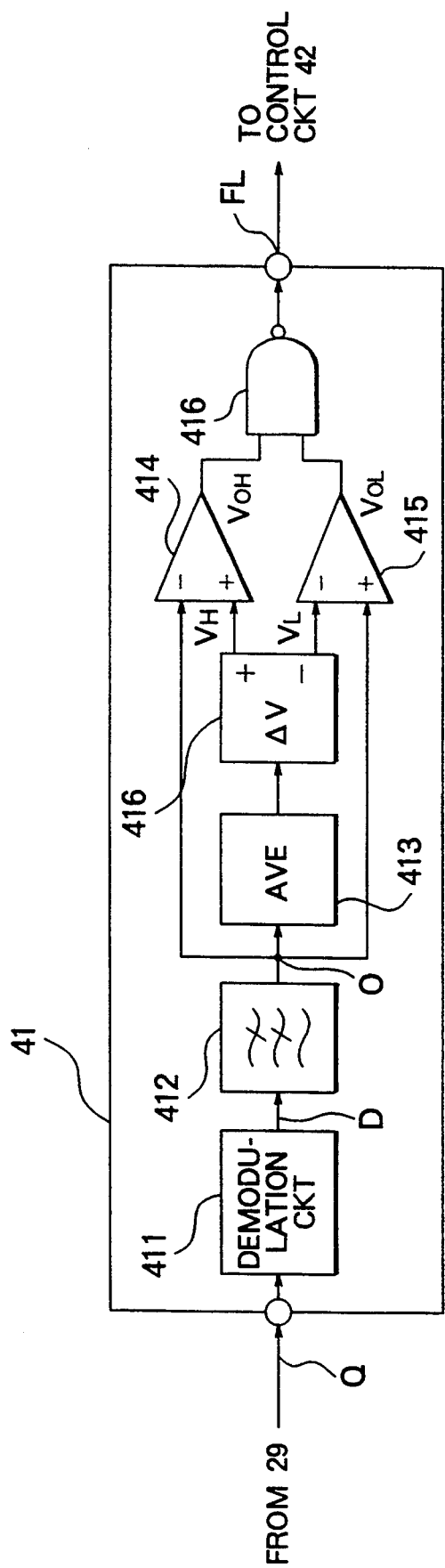
FIG. 4 is a block diagram of a frequency detector included in the receiver illustrated in FIG. 1.

Referring to FIG. 4, the frequency detector 41 is connected to the direct converter 20. Although the second baseband digital signal Q is given to the frequency detector 41 in the example being illustrated, the first baseband digital signal I may also be supplied to the frequency detector 41. The frequency detector 41 detects whether or not each of the first and the second baseband digital signals I and Q has a frequency falling with a predetermined frequency range and produces a control signal FL.

More specifically, the illustrated frequency detector 41 comprises a demodulation circuit 411 which inputs the second baseband digital signal Q to produce a sequence of pulses D.

Figure 5:
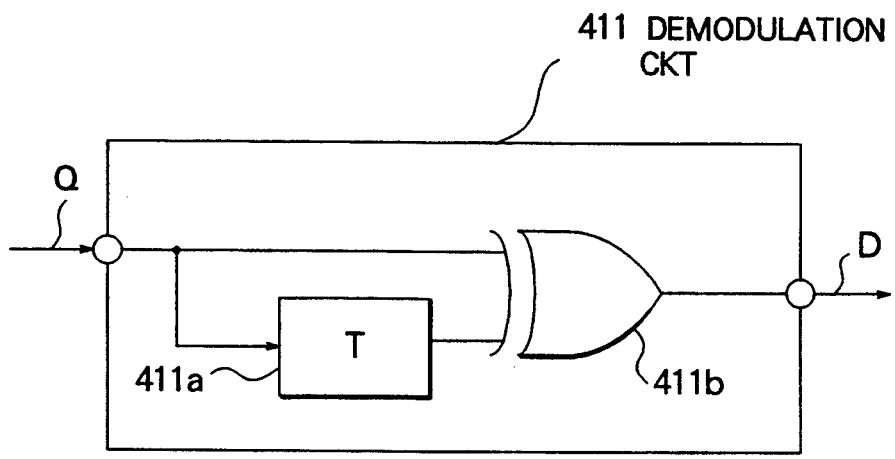
FIG. 5 is a block diagram of a demodulation circuit for use in the frequency detector illustrated in FIG. 4.
Figure 6:
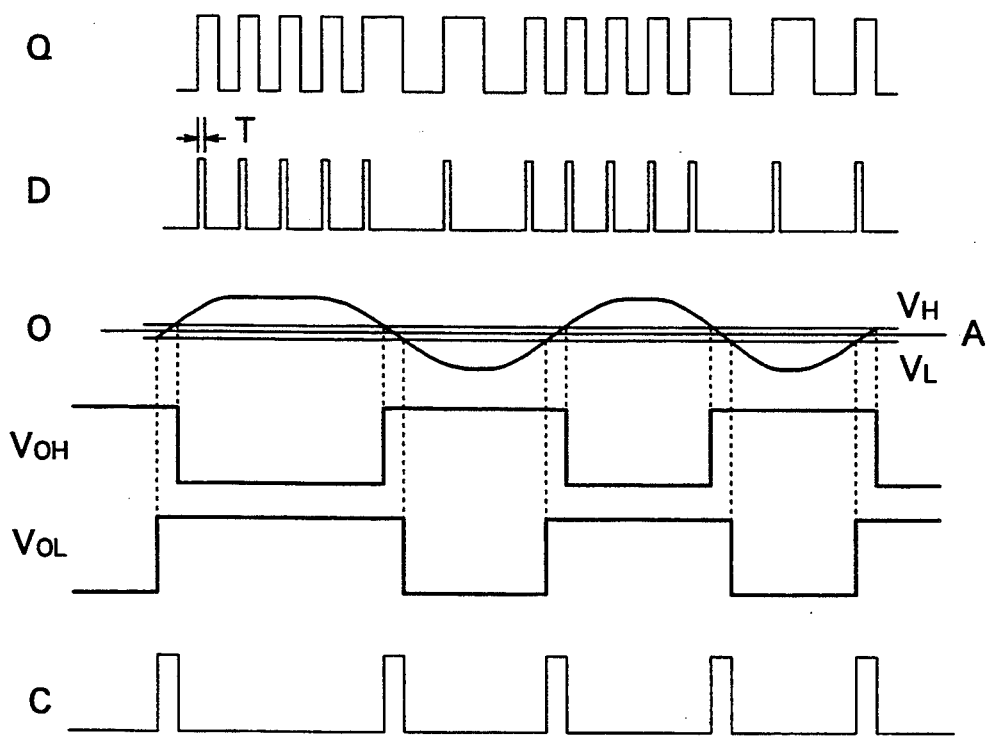
FIG. 6 is a time chart for use in describing operation of the frequency detector illustrated in FIG. 4.

As shown in FIGS. 5 and 6, the demodulation circuit 411 is composed of a delay detection circuit which comprises a delay circuit 411a of a delay time T and an Exclusive OR gate 411b.

Herein, the second baseband digital signal Q has first and second pulse frequencies which are assigned to the space and the mark on carrying out the FSK, as shown at a top line of FIG. 6. Specifically, a first period of the first pulse frequency is equal to a half of a second period of the second pulse frequency. The delay time T is assumed to be shorter than a half of the first period. Moreover, it is assumed that the second baseband digital signal Q which is sent from the second limiter 29 includes an offset frequency $\Delta F$ representative of a frequency deviation from the channel frequency. In this connection, each of the first and the second pulse frequencies is specified by $\pm FD - \Delta F$, where FD is representative of a maximum frequency deviation on the FSK.

It is readily understood that the Exclusive OR gate 411b produces a sequence of pulses D each of which has a pulse width equal to T, as illustrated along a second line of FIG. 6. Thus, the demodulation circuit 411 supplies the pulse sequence D to a low pass filter 412 shown in FIG. 4.

The low pass filter (LPF) 412 integrates the pulse sequence D into an integrated output signal O as shown along a third line of FIG. 6. The integrated output signal O is output from the LPF 412 to an average calculation circuit AVE 413 and to first and second comparators 414 and 415. It should be noted that the integrated output signal O has an amplitude proportional to the pulse frequency of the second baseband digital signal Q, as is apparent from FIG. 6, and may be produced as an output voltage from the LPF 412.

Figure 7:
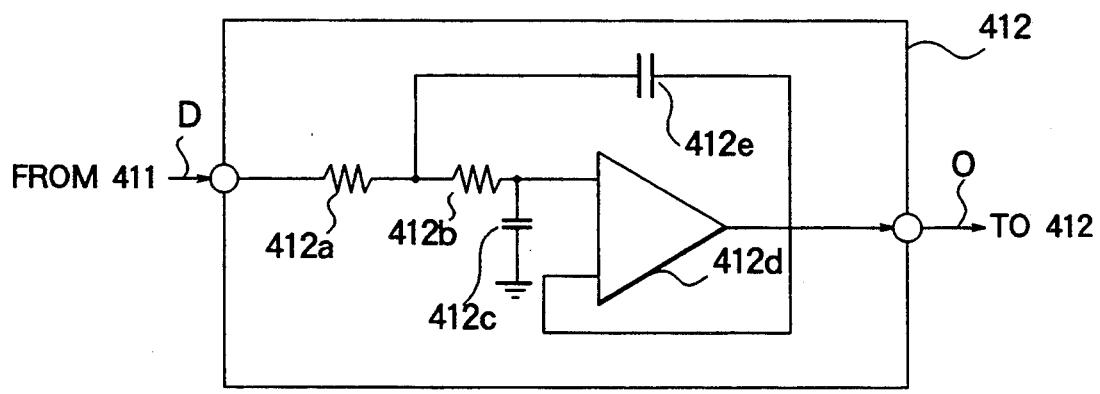
FIG. 7 is a block diagram of a low pass filter included in the frequency detector illustrated in FIG. 4.

As shown in FIG. 7, the LPF 412 comprises first and second resistors 412a and 412b connected in series to each other, a capacitor 412c having a terminal connected to the second resistor 412b and another terminal grounded, and a comparator 412d having an input terminal connected to the terminal of the capacitor 412c and another input terminal connected to an output terminal of the comparator 412d. An additional capacitor 412e is connected between the output terminal of the comparator 412d and a point of connection between the first and the second resistors 412a and 412b. With this structure, it is possible to integrate the pulse sequence D given to the first resistor 412a and to produce the integrated output signal O through the output terminal of the comparator 412d in a known manner.

Meanwhile, the second baseband digital signal Q has a frequency between $FD - \Delta F$ and $|-FD - \Delta F|$, where $\Delta F$ is indicative of the offset frequency, as mentioned before. When the second baseband digital signal Q is integrated by the LPF 412, the frequency of the integrated output signal O is averaged by the LPF 412 into an average frequency between $FD - \Delta F$ and $|-FD - \Delta F|$. As a result, the offset frequency is cancelled out of the average frequency of the integrated output signal O. Therefore, the average frequency becomes equal to FD.

Figure 8:
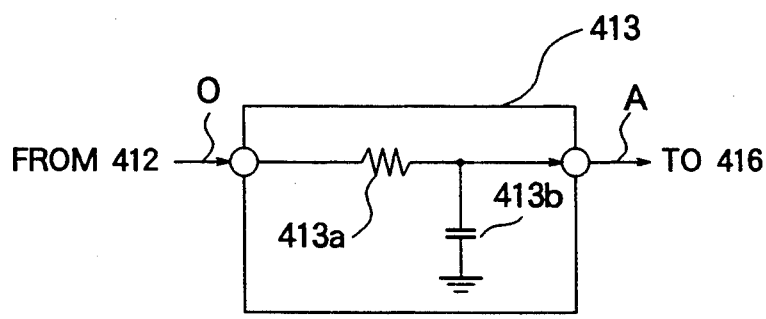
FIG. 8 is a block diagram of an average calculation circuit included in the frequency detector illustrated in FIG. 4.

Referring to FIG. 8, the average calculation circuit 413 is supplied with the integrated output signal O to calculate an average voltage A of the integrated output signal O. As shown in FIG. 8, the average calculation circuit 413 is structured by a time constant circuit which comprises a resistor 413a and a capacitor 413b and which has a time constant determined by the resistor 413a and the capacitor 413b in consideration of a reception band width. The illustrated average calculation circuit 413 forms an RC integration circuit of a first order, as readily understood from FIG. 8.

Figure 9:
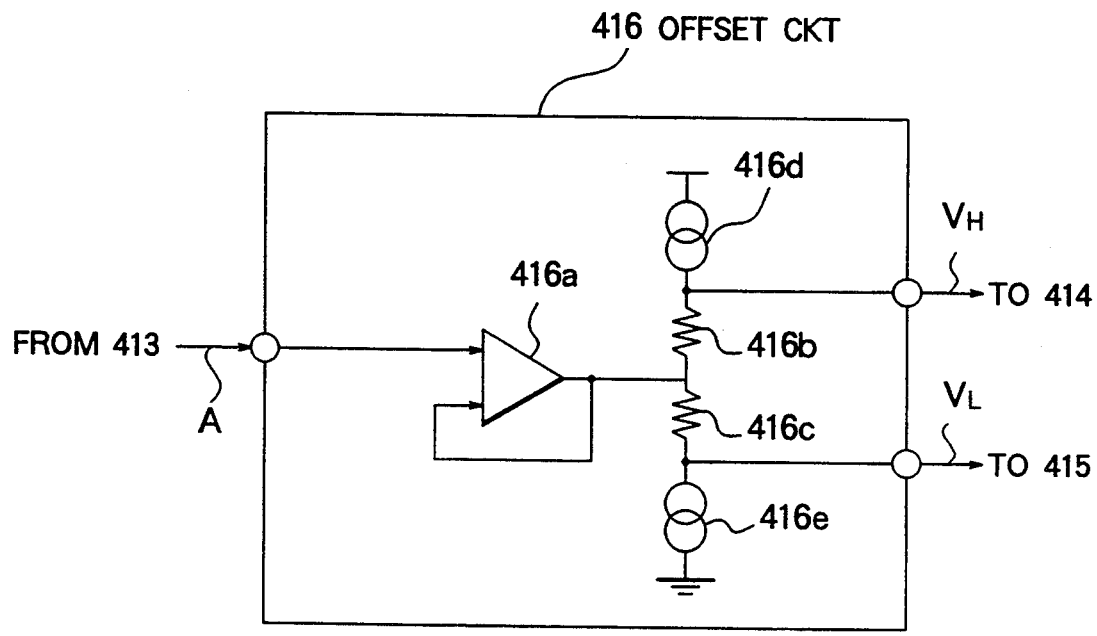
FIG. 9 is a block diagram of an offset circuit included in the frequency detector illustrated in FIG. 4.

Referring to FIG. 9, the average voltage A is output to an offset circuit 416 which adds predetermined voltages of $\pm \Delta V$ to the average voltage A. Each of the predetermined voltages $\pm \Delta V$ corresponds to a predetermined offset frequency, as will become clear as the description proceeds, and may be called predetermined offset voltages.

The offset circuit 416 comprises a voltage follower 416a having first and second input terminals and an output terminal which is connected to one of the first and the second input terminals in common, as illustrated in FIG. 9. The average voltage A is given to the remaining one of the input terminals of the voltage follower 416a.

In addition, the output terminal of the voltage follower 416a is connected to first and second output resistors 416b and 416c which are connected to first and second constant current circuits 416d and 416e, respectively. The first and the second output resistors 416a and 416b add the predetermined voltages $\pm \Delta V$ to the average voltage A. Consequently, first and second output voltages $V_H$ and $V_L$ are produced through a first point of connection between the first constant current circuit 416d and the first output resistor 416b and through a second point of connection between the second constant current circuit 416e and the second output resistor 416c, respectively. When the predetermined voltages $\pm \Delta V$ are added to the average voltage A, the first and the second output voltages $V_H$ and $V_L$ are represented by:

$$V_H = A + \Delta V \qquad \text{and (1)}$$

$$V_L = A - \Delta V. \qquad (2)$$

Figure 10:
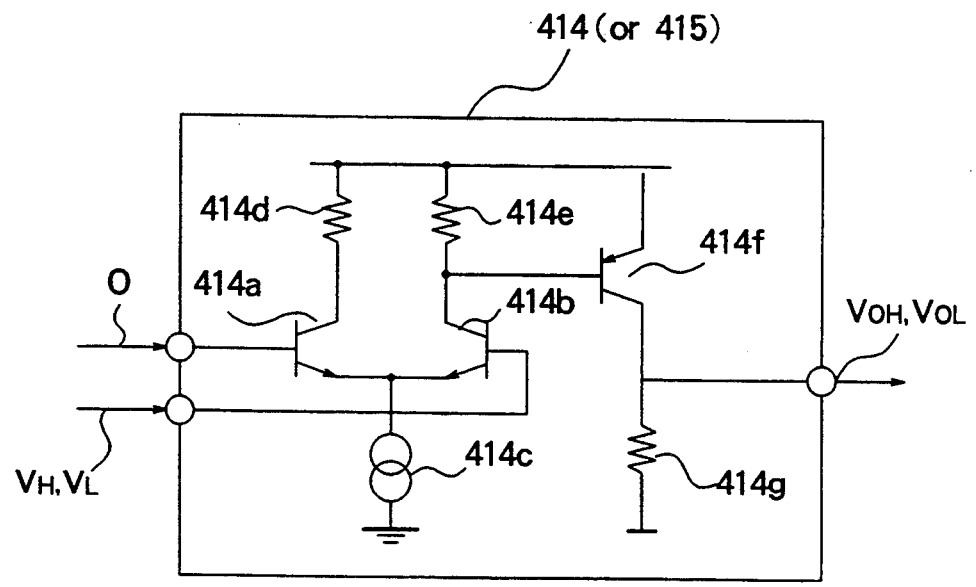
FIG. 10 is a block diagram of a comparator included in the frequency detector illustrated in FIG. 4.

Referring to FIG. 10, the first and the second output voltages $V_H$ and $V_L$ are supplied to the first and the second comparators 414 and 415 which input the integrated output signal O from the LPF 412. Each of the first and the second comparators 414 and 415 is similar in structure to each other, therefore, only the first comparator 414 is illustrated in FIG. 10. The first comparator 414 comprises first and second transistors 414a and 414b having emitters connected in common to a constant current source 414c, collectors connected to first and second resistors 414d and 414e, respectively, and bases supplied with the integrated output signal O and either one of the first and the second output voltages $V_F$ and $V_L$, respectively. The collector of the second transistor 414b is connected to an additional transistor 414f of a PNP type which is connected to an additional resistor 414g in series. The combination of the first and the second transistors 414a and 414b, the constant current source 414c, and the first and the second resistors 414d and 414e operates as a differential amplifier while the additional transistor 414f and the additional resistor 414g operates as a level shifter.

The differential amplifier supplies the level shifter with an internal voltage determined by a difference between the integrated output voltage O and each of the first and the second output voltages $V_H$ and $V_L$ represented by Equations (1) and (2) and either a first shifter output voltage $V_{OH}$ or a second shifter output voltage $V_{OL}$ appears at a point of connection between the additional transistor 414f and the additional resistor 414g.

In any event, it is assumed that the first shifter output voltage $V_{OH}$ takes a high level when the integrated output voltage O is lower than the first output voltage $V_H$ while the second shifter output voltage $V_{OL}$ takes a high level when the integrated output voltage O is higher than the second output voltage $V_L$.

As illustrated in FIG. 6, the first shifter output voltage $V_{OH}$ is low when the integrated output voltage O is higher than the first output voltage $V_H$ while the second shifter output voltage $V_{OL}$ is high when the integrated output voltage O exceeds the second output voltage $V_L$. High level durations of the first and the second shifter output voltages $V_{OH}$ and $V_{OL}$ are partially overlapped with each other, as depicted by the signal C in FIG. 6.

Referring to FIG. 4, the first and the second shifter output voltages $V_{OH}$ and $V_{OL}$ are supplied to a NAND gate 416 to produce the control signal FL. As readily understood from FIG. 4, the control signal FL produced by the NAND gate 416 is low level only when both the first and the second shifter output voltages $V_{OH}$ and $V_{OL}$ are high. In other words, the control signal FL intermittently becomes during the high level durations of the signal C in FIG. 6.

This means that the control signal FL takes the low level when the integrated output voltage O falls within the predetermined voltage range between $+\Delta V$ and $-\Delta V$. Stated otherwise, the control signal FL is high when the integrated output voltage O exceeds the predetermined voltage range defined by the predetermined offset voltages $+\Delta V$ and $-\Delta V$.

An operation of the frequency detector 41 mentioned above will be described more in detail on the assumption that the demodulation circuit 411 illustrated in FIGS. 4 and 5 has a demodulation sensitivity depicted at KD (V/kHz). In this event, the integrated output voltage O of the LPF 412 is given by:

$$O = KD \times \Delta f. \qquad (3)$$

Accordingly, when the integrated output voltage O, (i.e., namely, $KD \times \Delta f$), is smaller than the predetermined offset voltage depicted at $\Delta V$, the control signal FL is low. For example, let KD=10 mV/kHz and $\Delta V$=10 mV. In this case, the control signal FL is high when the $\Delta f$ is higher than 1 kHz.

As is apparent from FIG. 1, the control signal FL is supplied to the control circuit 42 which also receives the reproduced digital signal from the comparator 36. The control circuit 42 serves to control a battery saving operation in the direct converter 20 and the local frequency oscillation circuit 25.

Figure 11:
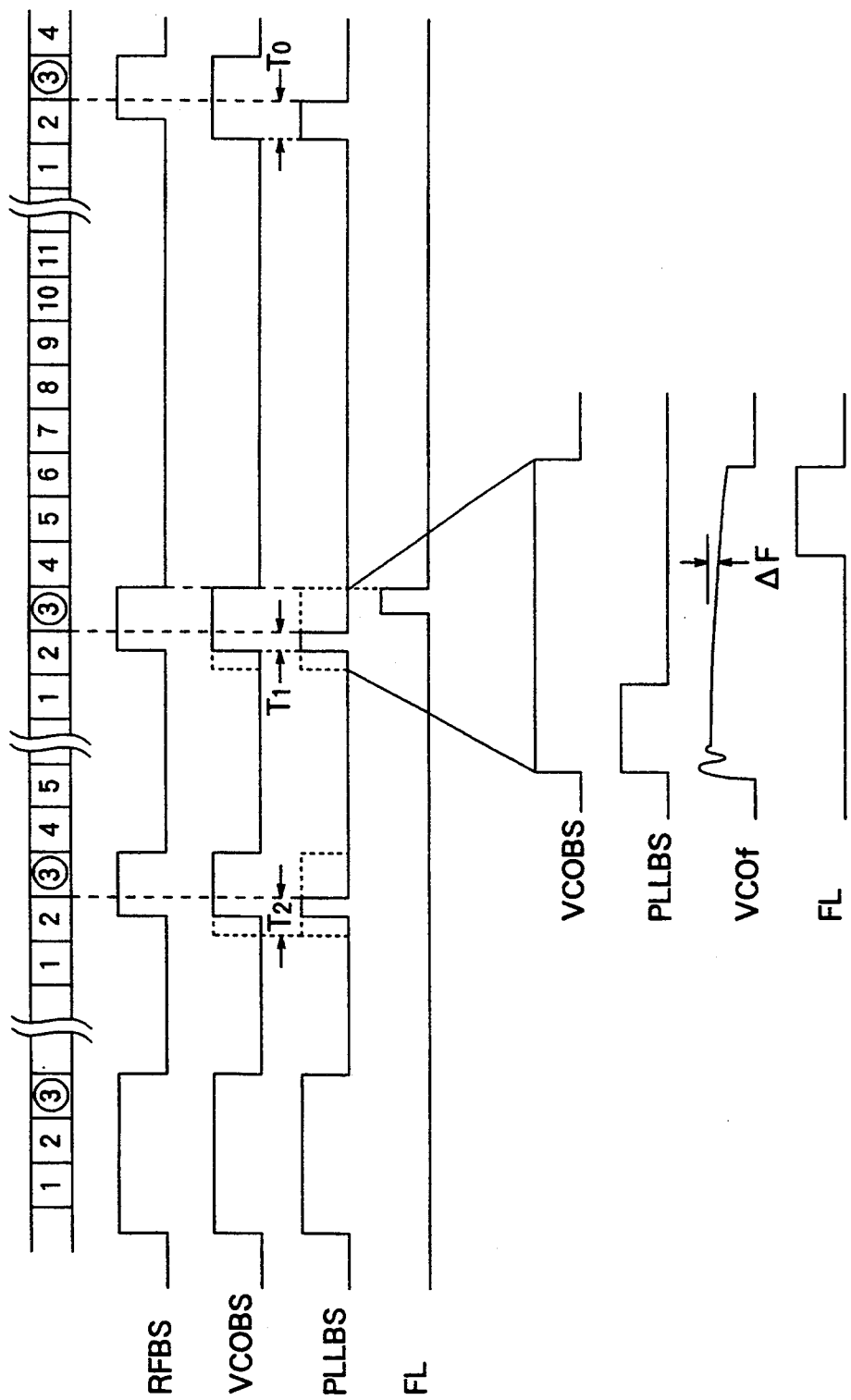
FIG. 11 is a time chart for use in describing operation of a control circuit included in the receiver illustrated in FIG. 1.

Referring to FIG. 11, it is assumed that the direct converter 20 is supplied with the input signal which comprises first through third groups of the data signals, as shown along a top, line of FIG. 11 and that the control circuit 42 extracts the third group of the data signals from the input signal, as symbolized by circles in FIG. 11. The third group of the data signals may be considered as being arranged in a preselected channel. In this case, the control circuit 42 delivers a first battery saving control signal RFBS to the direct converter 20, as shown along a second line of FIG. 11. In addition, the control circuit 42 delivers second and third battery saving control signals VCOBS and PLLBS to the local frequency oscillation circuit 25 (FIG. 1) in response to the control signal FL, as illustrated along third and fourth lines of FIG. 11.

Referring to FIG. 1, the local frequency oscillation circuit 25 comprises a PLL circuit 50, which is connected to the control circuit 42, a voltage controlled oscillator (VCO) 51, which is connected to the control circuit 42 and the PLL circuit 50, and a loop filter 52, which is connected between the PLL circuit 50 and the VCO 51. The VCO 51 feeds the local frequency signal back to the PLL circuit 50. Thus, the VCC 51, the loop filter 52, and the PLL circuit 50 forms a phase locked loop which is put into an active state and an inactive state by the second and the third battery saving control signals VCOBS and PLLBS. Specifically, the first battery saving control signal RFBS is sent to a power source (not shown) which intermittently activates the direct converter 20 while the second and the third battery saving control signals VCOBS and PLLBS are sent to the VCO 51 and the PLL circuit 50, respectively.

Referring to FIG. 11, the first battery saving control signal RFBS is initially high during a time interval of the first through the third groups and is high for a following time interval slightly longer than a time interval of the third group. Such a first battery saving control signal RFBS can be produced by the use of a conventional technique.

The third battery saving control signal PLLBS depends on the first battery saving control signal RFBS and the control signal FL sent from the frequency detector 41 (FIGS. 1 and 4) while the second battery saving control signal VCOBS depends on the third battery saving control signal PLLBS and the control signal FL.

More specifically, the third battery saving control signal PLLBS is specified by a sequence of pulses, each of which is determined by a leading edge and a trailing edge. A first pulse of the third battery saving control signal PLLBS appears in synchronism with the first battery saving control signal RFBS. Each of second and third pulses of the third battery saving control signal PLLBS has a leading edge synchronized with the first battery saving control signal RFBS and a trailing edge positioned before the third group is received. In other words, the third battery saving control signal PLLBS has a high level duration before reception of the third group. The high level duration is changed from T1 to T0 after reception of the control signal FL, as depicted at a fourth pulse in the third battery saving control signal PLLBS in FIG. 11. As readily understood from FIG. 11, the control signal FL is produced when the frequency deviation between the local frequency (depicted at VCOf) and the channel frequency becomes equal to $\Delta F$ which is determined by each of the predetermined offset voltage $\Delta V$.

On the other hand, the second battery saving control signal VCOBS has a leading edge synchronized with the leading edge of each pulse of the third battery saving control signal PLLBS and a trailing edge synchronized with that of the first battery saving control signal RFBS.

From FIG. 11, it is understood that the third battery saving control signal PLLBS has the high level duration which is shorter than that of the second battery saving control signal even though it becomes longer after reception of the control signal FL. This means that the high level duration of each pulse in the third battery saving control signal PLLBS is much shorter than that of the conventional third battery saving control signal depicted by broken lines. Likewise, the second battery saving control signal VCOBS is also shorter than that of the conventional second battery saving control signal specified by broken lines in FIG. 11.

Referring to FIG. 1, the first, the second, and the third battery saving control signals RFBS, VCOBS, and PLLBS illustrated in FIG. 11 are delivered to the power source of the direct converter 20, the VCO 51, and the PLL circuit 50, respectively. Consequently, the direct converter 20 is intermittently operated at least for the time interval longer than a reception time interval of the third group. Similarly, the VCO 51 is also activated during the reception of the second battery saving control signal VCOBS and is continuously operated during the reception of the third group.

However, it should be noted that the third battery saving control signal PLLBS is high during the time interval T1 and is low before the reception of the third group, as illustrated in FIG. 11. Therefore, the PLL circuit 50 is inactive during the reception of the third group. Stated otherwise, the PLL circuit 50 is placed in a high impedance state during the reception of the third group in order to supply a constant voltage to the loop filter 52 (FIG. 4). In addition, when the integrated output voltage O exceeds the predetermined offset voltage ΔV and the control signal FL is consequently given to the control circuit 42, the PLL circuit 50 is put into the active state for the time interval T0 longer than the time interval T1.

This means that the PLL circuit 50 is operated for a very short time when a frequency deviation is small between the local frequency and the channel frequency and that the PLL circuit 50 is operated for a comparatively long time when the frequency deviation is large. This is because the PLL circuit 50 is put into a pull-in state of synchronization with a very short time when the frequency deviation is small and, otherwise, the PLL circuit 50 is put into the pull-in state after a long lapse of time. Thus, the illustrated receiver can reliably establish synchronization even when the offset voltage exceeds the predetermined range.

Figure 12:
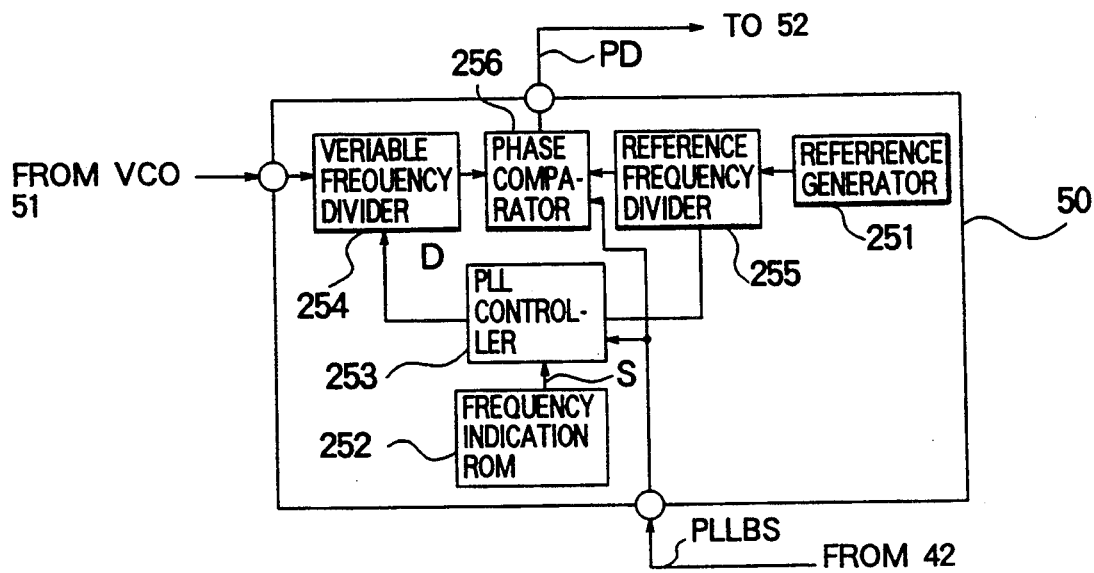
FIG. 12 is a block diagram of a PLL circuit included in the receiver illustrated in FIG. 1.

Referring to FIG. 12, the PLL circuit 50 comprises a reference generator 251 for generating a reference oscillation signal of an oscillation frequency (e.g., 10 kHz) and a frequency indication ROM 252 for indicating a frequency to be received by producing a frequency indication signal S (e.g., 14 bits) which indicates a frequency division factor. The reference generator 251 includes a single quartz crystal.

The frequency indication signal S is sent to a PLL controller 253 which is turned on or off in response to the third battery saving control signal PLLBS given from the control circuit 42 (FIG. 1). During the on-state, the PLL controller 253 supplies a variable frequency divider 254 and a reference frequency divider 255 with a division factor signal D. The variable frequency divider 254 is given the local frequency from the VCO 51 switched by the second battery saving control signal VCOBS while the reference frequency divider 255 is supplied with the reference oscillation signal.

Thus, the variable frequency divider 254 divides the local frequency into a divided local frequency while the reference frequency divider 255 divides the reference oscillation frequency into a divided reference frequency. Both the divided local frequency and the divided reference frequency are supplied to a phase comparator 256 to be subjected to phase comparison. The phase comparator 256 compares the phases of the divided local frequency and the divided reference frequency and produces a phase error signal PD which is representative of a phase error between the divided local frequency and the divided reference frequency. The phase error signal PD is sent through the loop filter 52 to the VCO 51.

The phase error signal PD is given to the VCO 51 as a control voltage, and the VCO 51 controls the local frequency in response to the control voltage FL. The VCO 51 feeds the local frequency back to the PLL circuit 50 so that the phase error is always kept constant.

In the illustrated example, the variable frequency divider 254 can change the frequency division factor in response to the division factor signal D sent from the PLL controller 253. This shows that the local frequency can be also varied in the VCO 51.

When the frequency indication signal S is composed of 14 bits, a maximum local frequency is given by:

$$(2^{15}-1) \times 10 \text{ kHz} = 327.67 \text{ MHz}.$$

Figure 13:
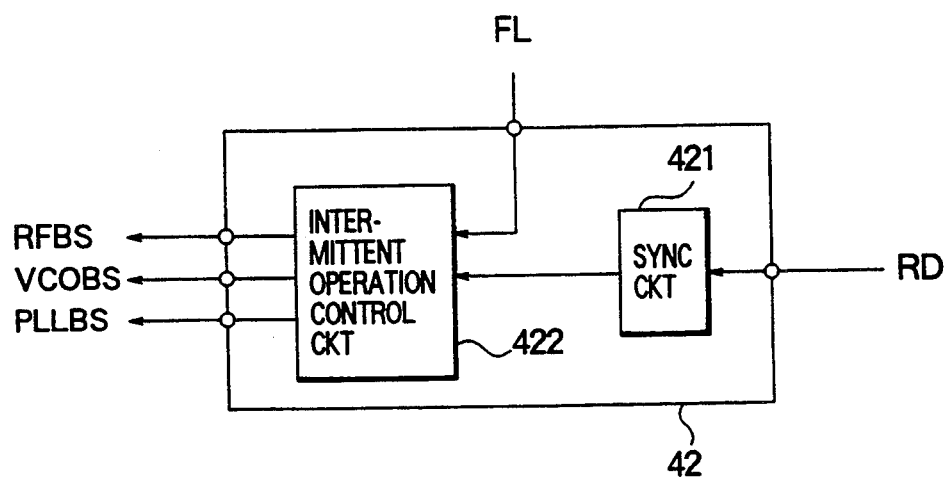
FIG. 13 is a block diagram of a control circuit included in the receiver illustrated in FIG. 1.

Referring to FIG. 13, the control circuit 42 is supplied with the reproduced data signal RD from the comparator 36 (FIG. 1) and the control signal FL from and the frequency detector 41 to produce the first through the third battery saving control signals RFBS, VCOBS, and PLLBS, as shown in FIG. 11. The control circuit 42 comprises a synchronization circuit 421 and an intermittent operation control circuit 422. The synchronization circuit 421 establishes bit and frame synchronization in response to the reproduced data signal RD in a known manner to produce a sequence of timing signals TM. The intermittent operation control circuit 422 inputs the timing signal sequence TM to produce the first battery saving control signal RFBS, as shown in FIG. 11.

Likewise, the intermittent operation control circuit 422 produces the third battery saving control signal PLLBS which is determined by the timing signals and the control signal FL. Such a third battery saving control signal PLLBS can be produced by measuring the time intervals T1 and T2 with reference to the timing signals and the control signal FL and by putting a timer into a set state or a reset state on the basis of the measurement of the time intervals T1 and T2. Therefore, the third battery saving control signal PLLBS can be readily produced by combining known circuit elements. In addition, the second battery saving control signal VCO BS can be produced by a flip flop which is put in a set state at a leading edge of the third battery saving control signal PLLBS and in a reset state at a trailing edge of the first battery saving control signal RFBS.

While this invention has thus far been described in conjunction with a preferred embodiment thereof, it will readily be possible for those skilled in the art to put this invention into practice in various other manners. For example, the modulated wave which is given to the receiver may not be restricted to the FSK modulated wave but may be a PSK modulated wave or the like. In addition, a quadrature modulated wave may be also supplied to the receiver. Furthermore, the local oscillation frequency circuit 25 may generate an invariable local frequency.

What is claimed is:

1. A receiver that responds to a modulated signal, which is subjected to modulation by a baseband digital signal and which has a channel frequency, wherein said receiver comprises:

demodulating means, wherein said demodulating means is supplied with said modulated signal and a local frequency signal of a local frequency, for carrying out demodulation of said modulated signal by using said local frequency signal to demodulate said baseband digital signal into a demodulated signal;

local signal supplying means, which has a phase locked loop selectively put into an inactive state and an active state, for supplying said local frequency signal to said demodulating means;

frequency difference detecting means coupled to said demodulating means for detecting a frequency difference between said channel frequency and said local frequency to determine whether or not said frequency difference falls within a predetermined range and to produce a control signal when said frequency difference exceeds said predetermined range; and controlling means coupled to said frequency difference detecting means and said local signal supplying means for controlling said local signal supplying means to put said phase locked loop of said local signal supplying means into said active state in a presence of said control signal so as to keep said local frequency under control of said phase locked loop and to put said phase locked loop into said inactive state in an absence of said control signal so as to keep said local frequency with said phase locked loop kept inactive.

2. The receiver as claimed in claim 1, wherein said local signal supplying means comprises:

a voltage controlled oscillator coupled to said controlling means to produce said local frequency signal;

a PLL circuit which is coupled to said controlling means and said voltage controlled oscillator to form said phase locked loop, wherein said PLL circuit comprises frequency generating means for generating a predetermined reference frequency, and wherein said PLL circuit produces a phase error signal according to a predetermined local frequency related to said local frequency signal and said predetermined reference frequency under control of said controlling means; and phase error signal supplying means for supplying said phase error signal to said voltage controlled oscillator to control said local frequency signal.

3. The receiver as claimed in claim 2, wherein said frequency generating means of said PLL circuit comprises:

a reference frequency generator for generating a reference frequency signal of a reference frequency;

a reference divider which frequency divides said reference frequency into said predetermined reference frequency;

and wherein said PLL circuit further comprises:

a variable divider for dividing said predetermined local frequency into said local frequency; and a phase error detection circuit for comparing said predetermined reference frequency with said local frequency to supply said phase error signal to said voltage controlled oscillator through Said phase error signal supplying means to form said phase locked loop.

4. The receiver as claimed in claim 1, wherein said frequency difference detecting means comprises:

detection means for detecting said baseband signal to produce a detected signal which has a detected voltage;

average means supplied with said detected signal for calculating an average voltage of said baseband signal;

adding means for adding first and second predetermined offset voltages to said average voltage to produce first and second output voltages representative of sums of each of said first and said second predetermined offset voltages and said average voltage; and means for comparing said first and said second output voltages with said detected signal to produce said control signal on the basis of a result of the comparison.

5. A receiver that responds to a modulated signal which is modulated by a data signal and a local frequency signal of a local frequency by producing a desired baseband signal which carries said data signal with reference to said modulated signal and said local frequency signal and by demodulating said desired baseband signal into a reproduced data signal representative of said data signal, said desired baseband signal having a reference value, wherein said receiver comprises:

offset detecting means supplied with said desired baseband signal for detecting an offset amount from said reference value to determine whether or not said offset amount falls within a predetermined range and to produce a control signal only when said offset amount does not fall within said predetermined range;

local oscillation frequency generating means for generating said local frequency signal before reception of said desired baseband signal to keep said local frequency signal during said reception of said desired baseband signal, wherein said local oscillation frequency generating means carries out a phase locked operation in response to an operation control signal by carrying out said phase locked operation before said reception of said desired baseband signal; and operation control means for producing said operation control signal in response to said control signal and said reproduced data signal.

6. The receiver as claimed in claim 5, wherein said operation control means comprises:

signal supplying means supplied with said reproduced data signal and said control signal for supplying said local oscillation frequency generating means with said operation control signal, wherein said operation control signal comprises a sequence of pulses which have a predetermined width in an absence of said control signal and an additional pulse which has a width longer than said predetermined width in a presence of said control signal;

said local oscillation frequency generating means carrying out said phase locked operation for a time interval determined by said operation control signal.

7. The receiver as claimed in claim 5, wherein said operation control signal includes a primary battery saving control signal which defines a generation duration of said local frequency signal and includes an additional battery saving control signal which defines an operation duration of said phase locked operation which is shorter than said generation duration;

and wherein said local oscillation frequency generating means comprises:

a voltage controlled oscillator supplied with said primary battery saving control signal for generating said local frequency signal during a first time interval defined by said primary battery saving control signal; and a PLL circuit which is coupled to said voltage controlled oscillator for carrying out said phase locked operation during a second time interval defined by said additional battery saving control signal.

8. The receiver as claimed in claim 7, wherein each of said generation duration of said local frequency signal and said operation duration of said phase locked operation becomes longer after reception of said control signal in said operation control means than each of said generation duration and said operation duration before said control signal is received by said operation control means.

* * * * *

UNITED STATES PATENT AND TRADEMARK OFFICE
CERTIFICATE OF CORRECTION

PATENT NO. : 5,396,521
DATED : March 7, 1995
INVENTOR(S) : Yoichiro MINAMI

It is certified that error(s) appears in the above-identified patent and that said Letters Patent is hereby corrected as shown below:

Column 1, line 11, delete "becomes" and insert --become--;

Column 1, line 39, delete "render".

Signed and Sealed this

Twelfth Day of December, 1995

*Attest:*

BRUCE LEHMAN

*Attesting Officer*    *Commissioner of Patents and Trademarks*